US009411918B1

(12) United States Patent  
O'Donovan et al.

(10) Patent No.: US 9,411,918 B1  
(45) Date of Patent: Aug. 9, 2016

(54) SIMPLIFIED DEVICE MODEL EXTENSION USING SUBCIRCUITS

(71) Applicant: Cadence Design Systems, Inc., San Jose, CA (US)

(72) Inventors: John O'Donovan, San Jose, CA (US); Jushan Xie, Pleasanton, CA (US); Saibal Saha, Cupertino, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 501 days.

(21) Appl. No.: 13/950,212

(22) Filed: Jul. 24, 2013

(51) Int. Cl.
*G06F 17/50* (2006.01)

(52) U.S. Cl.
CPC ........ *G06F 17/5045* (2013.01); *G06F 17/5036* (2013.01)

(58) Field of Classification Search
CPC ............. G06F 8/41; G06F 8/51; G06F 11/26; G06F 17/5022; G06F 17/5036; G06F 17/505; G06F 17/5081
See application file for complete search history.

(56) References Cited

U.S. PATENT DOCUMENTS

| | | | | |
|---|---|---|---|---|
| 6,053,947 A * | 4/2000 | Parson | ................ | G06F 17/5022 703/13 |
| 6,381,563 B1 * | 4/2002 | O'Riordan | .......... | G06F 17/5036 703/14 |
| 6,957,423 B1 * | 10/2005 | Ma | ............................ | G06F 8/51 717/106 |
| 7,305,650 B1 * | 12/2007 | Jensen | .................. | G06F 17/505 716/105 |
| 2002/0100029 A1 * | 7/2002 | Bowen | ....................... | G06F 8/41 717/140 |
| 2013/0007684 A1 * | 1/2013 | Kramer | ............... | G06F 17/5081 716/112 |
| 2013/0111422 A1 * | 5/2013 | Reed | .................... | G06F 17/5081 716/102 |
| 2013/0145213 A1 * | 6/2013 | Tang | ....................... | G06F 11/26 714/33 |

* cited by examiner

*Primary Examiner* — Kandasamy Thangavelu  
(74) *Attorney, Agent, or Firm* — Kenyon & Kenyon LLP

(57) ABSTRACT

A system, method, and computer program product for extending device model parameter specification flexibility when using a subcircuit wrapper. Embodiments facilitate device modeling by allowing a modeling engineer to eliminate the explicit specification of a large set of wrapped device instance parameters as parameters to the subcircuit wrapper itself. A circuit designer may now use the subcircuit wrapper to specify an instance of the subcircuit without having to explicitly provide values for all such parameters. The simulator program's built-in device model calculates its default parameter values, which are often the result of complex expressions involving the other parameters, resulting in more accurate simulations. Subcircuit wrappers no longer need to be explicitly regenerated when a new version of the wrapped device model becomes available for the simulator (e.g., one that supports additional instance parameters that were not present on the earlier version when the subcircuit wrapper was created).

20 Claims, 10 Drawing Sheets

200 subckt S1 (a b)

r1 (a b) resistor r= 1k c1 (b 0) capacitor c=1u ends

FIG. 2 subckt NMOS (d g s b )

parameters w=1u l=0.5u as=1p ad=1p ps=2u pd=2u c1=1f ....

M1 (d g s b) nch w=w l=l as=as ad=ad ps=ps pd=pd ....

c_gs (g s) capacitor c=1f model nch bsim4 type=n version=4.5 ....

ends NMOS

X1 (d1 g2 s1 b1) NMOS w=2u l=0.18u

*line 1:* inline subckt NMOS (d g s b)

*line 2:* parameters w=1u l=0.5u as=1p ad=1p ps=2u pd=2u c1=1f ....

*line 3:* NMOS (d g s b) nch w=w l=l as=as ad=ad ps=ps pd=pd ....

*line 4:* c_gs (g s) capacitor c=c1

*line 5:* model nch bsim4 type=n version=4.5 ....

*line 6:* ends NMOS

*line 7:* X1 (d1 g1 s1 b1) NMOS w=2u l=0.18u

*line 1:* inline inherited subckt NMOS (d g s b)

*line 2:* parameters c=1f ....

*line 3:* NMOS (d g s b) NCH ...

*line 4:* c_gs (g s) capacitor c=c1

*line 5:* model nch bsim4 type=n version=4.5 ....

*line 6:* ends NMOS

*line 7:* X1 (d1 g1 s1 b1) NMOS w=2u l=0.18u

700 inline inherited subckt NMOS (d g s b)
parameters c1=1f ....
NMOS (d g s b) nch ....
c_gs (g s) capacitor c=c1
model nch bsim4 type=n version=4.5 ....
ends NMOS X1 (d1 g1 s1 b1) NMOS w=2u l=0.18u inline inherited subckt OUTER (d g s b)
parameters ....
... *(OTHER COMPONENTS)* ...
OUTER (d g s b) NMOS ....
ends OUTER X2 (d2 g2 s2 b2) OUTER w=1.23u l=4.56u

FIG. 7

SIMPLIFIED DEVICE MODEL EXTENSION USING SUBCIRCUITS

BACKGROUND

This patent application relates to the field of circuit simulation, and more precisely to more easily managing component models, model parameters, and further components added using subcircuits.

Designers of electronic circuits frequently use various techniques to test and modify their designs. Such designers may for example use computer software to create a circuit design with electronic component representations. The initial design may be simulated with the software, to ensure proper functionality. A variety of commercially offered software programs are available for circuit simulation, including those based on SPICE-type simulator interfaces and/or algorithms.

Circuit designers attempt to meticulously model the various circuit components to ensure the simulation results match actual manufactured component behaviors. Component representations in a design may be entirely user-defined, but more often are instances of components or devices previously installed into the simulation program, often by software vendors. Such built-in or "primitive" component instances may include transistors, resistors, capacitors, and various other circuit elements as may be known in the art. The component instances may be tailored to behave in precise ways, often by the specification of a number of parameters.

Circuit designers may also use a hierarchical design structure to more efficiently create a circuit. This concept permits a single component or a group of components to be represented as a subcircuit, for example. Use of hierarchical structures further presents a more abstract view at any hierarchical design level, allowing the designer to concentrate on the simulation program interface at that level without worrying about lower level details.

Management of the component instance parameters used in hierarchical designs is not always straightforward, however. Subcircuits may be nested, and may contain not only component instances with specified parameters, but also model statements that may specify parameters for built-in models. Further, some commonly used built-in components may have a large number of possible parameters (e.g., forty or more), and the behavior of each component instance may depend strongly on whether a parameter value was actually specified or was left unspecified. In other words, omission of a parameter may have more impact than merely having that one parameter take on a predetermined default parameter value.

Component instances may have complex interdependent parameter interactions, with some default parameter values being calculated from other parameters for example. Further, different simulation programs may process circuit designs somewhat differently. As a result, modeling engineers must spend significant time and effort to ensure proper and consistent component simulation behavior.

For example, it is a common practice for modeling engineers to extend device models using a subcircuit "wrapper". Such a subcircuit may include an instance of a built-in device (e.g., a MOSFET) as well as additional parasitic resistances and capacitances or other circuit elements selected to more precisely model an actual manufactured device. Instead of using an instance of a built-in device directly in a circuit design, a designer may decide to use a subcircuit containing such an "extended" device. Many integrated circuit foundries provide such subcircuit wrappers for devices made via their particular processes.

This practice presents some difficulties in current simulator programs. First, commonly used built-in devices may have many parameters that determine their behavior, and at present these parameters must all be explicitly declared as subcircuit parameters when using a subcircuit wrapper. Second, when the built-in device is instantiated in the subcircuit, its parameters will be set on the device instance line. However, there is currently no capability in subcircuits to only set a parameter if the user has explicitly specified its value on the subcircuit instance line itself. The behavior of the built-in device model may change, as previously described, depending upon whether a parameter is actually specified or is left unspecified.

Accordingly, the inventors have developed a novel way to extend device model parameter specification flexibility when using a subcircuit wrapper.

BRIEF DESCRIPTION OF THE DRAWINGS

FIG. 2 is a subcircuit netlist, according to an embodiment.

FIG. 7 is a nested inline inherited subcircuit wrapper netlist for an extended transistor, according to an embodiment.

DETAILED DESCRIPTION

This patent application presents a new system, method, and computer program product for creating a circuit design that provides increased flexibility for simplified component model parameter management. Embodiments enable a user to place in a circuit design an inline subcircuit that includes an inline component and an inheritance designator. A circuit simulator may then process the inherited inline subcircuit to assign a default value to an unspecified inline component model parameter according to a built-in component model parameter defaulting rule.

The inherited inline subcircuit may be called from another layer in a design hierarchy. The inline component may be any built-in component supported by the circuit simulator. The circuit simulator may recognize an inheritance designator in the inline subcircuit definition to determine that a particular inline subcircuit is to follow the new component model parameter assignment methodology. The inheritance designator may comprise the keyword "inherited" for example, to distinguish particular inline subcircuits as inherited. The embodiments may then simulate the circuit design with the circuit simulator and output tangible simulation results.

The inherited inline subcircuit wrappers of the embodiments may assign a specified value to an inline component model parameter through either a subcircuit instance line or a subcircuit parameter line, for example. The model parameter value used may be determined by the value specified in the highest design hierarchy level that provides the particular specified parameter value. Thus, specified model parameters may be passed from the uppermost layer of a hierarchy downward, while unspecified model parameters may acquire their default values according to the built-in component model's defaulting rules.

Figure 1:
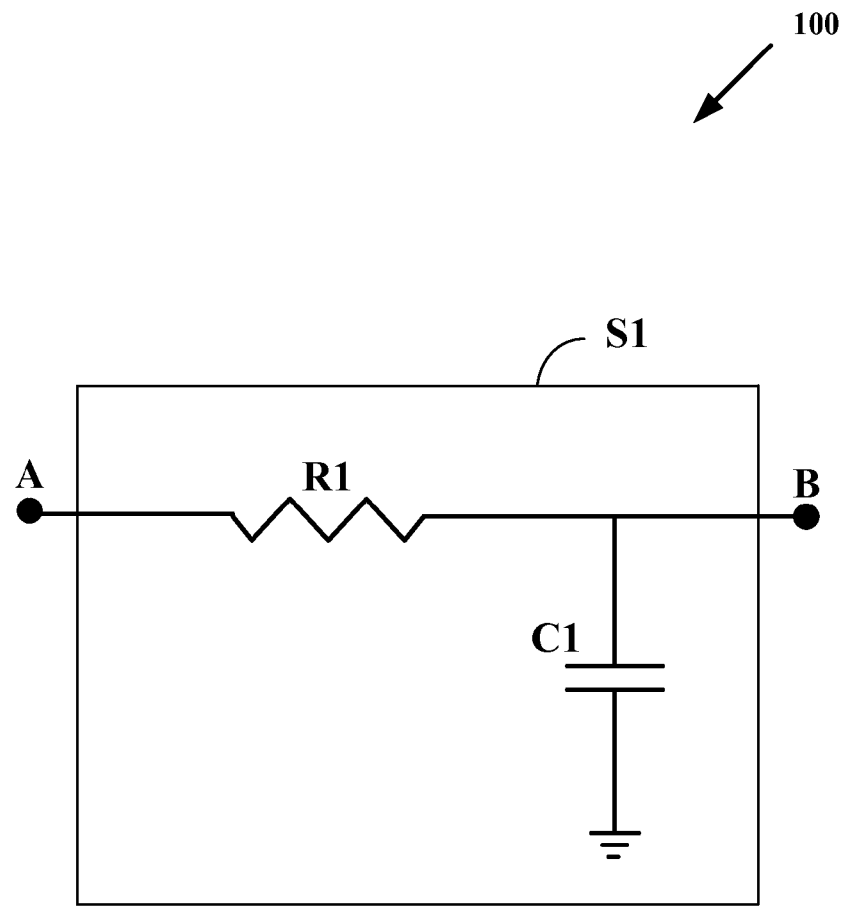
FIG. 1 is a subcircuit schematic diagram, according to an embodiment.

FIG. 1 shows a subcircuit schematic diagram, according to an embodiment. Subcircuit S1 has nodes A and B, and contains a resistor R1 and a capacitor C1. Resistor R1 is connected between nodes A and B, while capacitor C1 is connected from node B to ground. Although the subcircuit 100 shown is quite simple, it is merely an example of how components may be grouped into blocks that may be re-used by calling multiple subcircuit instances in a hierarchical design.

FIG. 2 shows a subcircuit netlist 200, according to an embodiment. This netlist corresponds to the subcircuit schematic diagram of FIG. 1. In this example, resistor r1 is a 1 kOhm resistor (i.e., its resistance is 1000 Ohms), and c1 is a 1 uF capacitor (i.e., its capacitance is $10^{-6}$ Farads). These component values are embedded constants that are specified in the subcircuit listing itself, and are not passed in or inherited from elsewhere. The "ends" card specifies the end of the subcircuit definition. Such subcircuits are familiar to those of ordinary skill in the art of circuit simulation.

Figure 3:
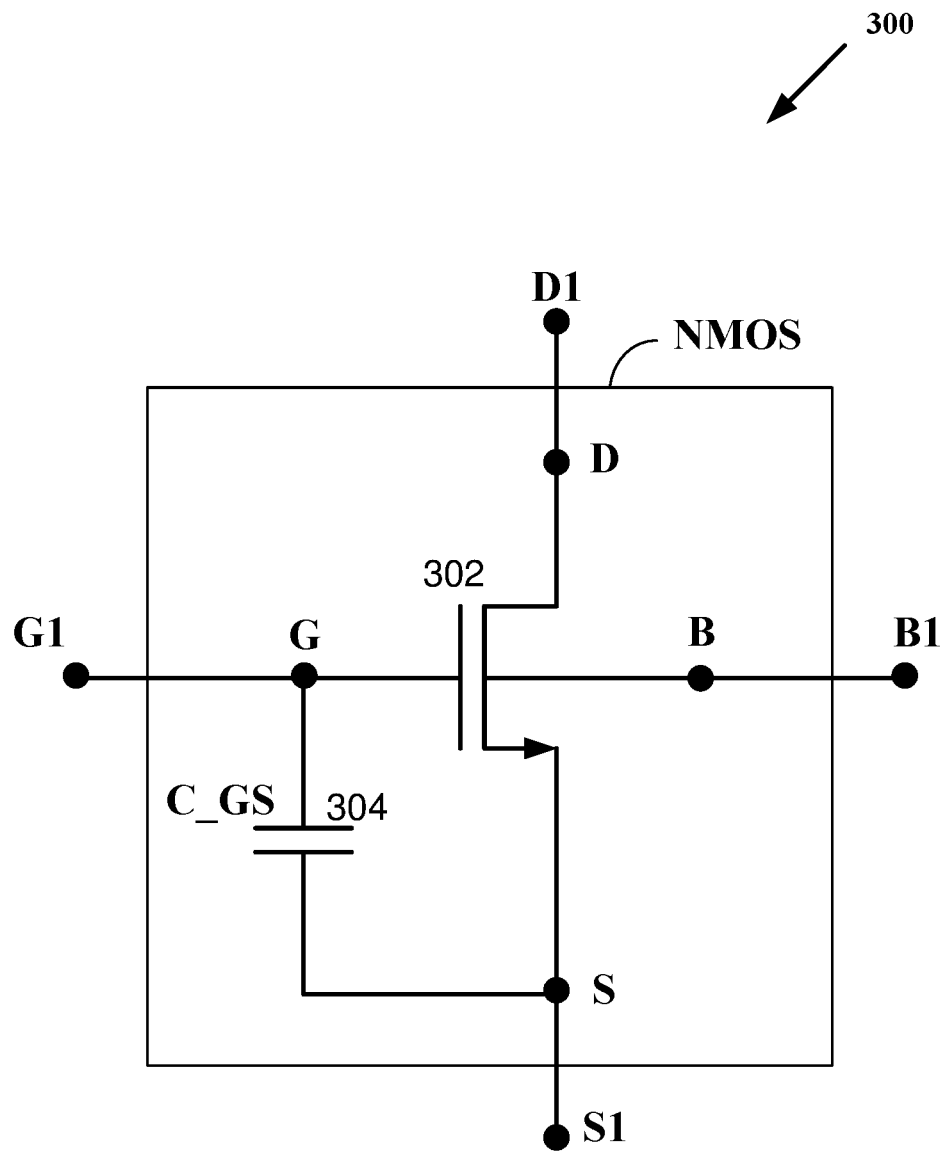
FIG. 3 is a subcircuit wrapper schematic diagram for an extended transistor, according to an embodiment.

FIG. 3 shows a subcircuit wrapper schematic diagram 300 for an extended transistor, according to an embodiment. As described above, transistors and other components are often modeled with subcircuit wrappers that combine a built-in component model with other circuit elements. In this example, a MOSFET 302 is combined with a separate fixed capacitor 304 connected between the gate terminal and the source terminal. Although only one additional circuit element is provided with the built-in component model in this example, many additional circuit elements may be added as needed to more accurately model actual component behavior.

As device model complexity increases, a significant number of model parameters for the built-in models of a simulator program may need to be managed. Similarly, a significant number of values for many additional circuit elements in a subcircuit may need to be managed. In most SPICE-based simulator programs, all component model parameter values and additional circuit element values must be declared explicitly.

Figure 4:
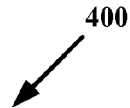
FIG. 4 is a subcircuit wrapper netlist for an extended transistor, according to an embodiment.

FIG. 4 shows a subcircuit wrapper netlist 400 for an extended transistor, according to an embodiment. The device model parameters (in this case, type, version, w, l, as, ad, ps, and pd) may be declared in a model card, and the additional circuit element value for the separate gate-source capacitor may be given in the subcircuit definition. In some simulator programs, none of these values may be passed in or inherited, and the nodes (except for ground, typically) and components inside a subcircuit may be strictly local. In other more flexible simulator programs, a subcircuit may include a "parameters" line, as shown, and may allow model parameter values to be set or calculated from formulae defining various combinations of provided subcircuit parameters. This parameter specification feature may simplify the automation of geometrical scaling of devices, for example.

Figure 5:
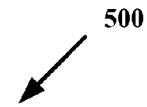
FIG. 5 is an inline subcircuit wrapper netlist for an extended transistor, according to an embodiment.

FIG. 5 shows an inline subcircuit wrapper netlist 500 for an extended transistor, according to an embodiment. An inline subcircuit is a special type of subcircuit, where one of the devices or models instantiated in the subcircuit does not get its full hierarchical name. Instead, the device or model inherits the subcircuit call name itself. The keyword "inline" before the remainder of the subcircuit definition tells the simulation program netlist parser that this subcircuit is to be processed differently. Relevant voltages and currents for example for an inline subcircuit may be saved and outputted by referencing the subcircuit call name itself.

Inline subcircuits are described in detail in U.S. Pat. No. 6,381,563B1, which is hereby incorporated by reference, and provide significantly more flexibility for managing parameters in hierarchical designs. Inline subcircuits are frequently used to help manage component model parameters in subcircuits that "wrap" a built-in component model with additional circuit elements for improved accuracy. A line-by-line description of the inline subcircuit wrapper netlist of FIG. 5 is now provided.

In line 1, the inline subcircuit "NMOS" is declared. (Note, in this simulator program the first letter of a device does not necessarily determine its device type, unlike traditional SPICE simulators. The device type may be specified on a subsequent line, as is the case in this example.) The nodes of the NMOS component are then listed, with "d g s b" corresponding to drain, gate, source, and bulk, as familiar to one of ordinary skill in the art. Next, in line 2, declared subcircuit parameters are provided. These parameters may be used to assign values to component model parameters or to additional circuit elements. In this example, subcircuit parameter values for w, l, as, ad, ps, pd, and c1 are specified. c1 is used to set the capacitor c_gs to a value of 1 fF (i.e. $10^{-15}$ Farads), while the other subcircuit parameters are used to set various geometry related MOSFET model parameter values.

In line 3, an instance of inline component "NMOS" is defined; this component is the inline component because it shares the same name as the subcircuit. In this example, NMOS is an n-channel MOSFET, as specified by device type "nch". The component model parameters, which share the same name as the inline subcircuit parameters of line 2, are then initially set equal in value to the subcircuit parameters that were defined in line 2, i.e. w(model)=w(subcircuit), and l(model)=l(subcircuit), etc.

In general, when a child device is instantiated in the parent subcircuit, the child's parameters will be set on the device instance line. If there are many device parameters, as is common with modern built-in device models, it is possible that errors will be introduced in the netlist through simple typing mistakes. This is always possible where human netlist editing occurs.

There are more insidious problems lurking in this scenario, however. First, for a user to set device model parameters when a subcircuit wrapper is used, the model parameters must be explicitly declared as subcircuit parameters. Second, there is currently no capability in subcircuits to restrict the assignment of device model parameter values to those explicitly stated subcircuit parameter values. Unspecified device model parameter values may be determined and set according to defaulting rules of the built-in device model in the simulator program. These parameter defaulting rules may be very complex, and omission of a model parameter value may have unintended impact.

At present, modeling engineers sometimes implement a set of cumbersome logical rules in a model testing tool to help detect unintentionally unspecified or erroneously specified subcircuit parameters. For example, modeling engineers may assign all subcircuit parameters that are to be used to determine device model parameters to some nonsensical default values, then assign the specified subcircuit parameters to their corresponding device model parameters. Next, a set of if/then checks may be executed to determine if any nonsensical subcircuit parameter values were not overridden. In this way, only intentionally specified reasonable subcircuit parameter values are passed onto devices, and any omission of parameter values may be detected.

Continuing at line 4, the capacitor may acquire its assigned value c1 from the subcircuit parameters specified on line 2. Line 5 is a built-in model card, that in this case uses exemplary and non-limiting "bsim4" as its primitive. Line 6 ends the subcircuit definition. Line 7 is an instance X1 of the now-defined inline subcircuit NMOS.

For subcircuit instance X1, only parameters w and l are specified, so inline component X1.NMOS inside X1 will now get the following parameter values:

X1.W=2 u (from line 7, the X1 instance)

X1.L=0.18 u (from line 7, the X1 instance)

Thus, X1.AS, X1.AD, X1.PS, and X1.PD are either always specified or always unspecified, as shown in the two examples above. There is currently no flexible way to make them behave as normal primitive parameters with explicit parameter passing. This presents a problem, since some of these parameters are calculated in primitive/built-in models if they are not specified, as previously noted.

The embodiments of the present invention enable a new parameter management methodology that does not require a subcircuit definition to declare a subcircuit parameter if that subcircuit parameter is the instance parameter of a subcircuit component primitive. The embodiments define a new type of subcircuit that may inherit some or all instance parameters of the inline subcircuit component, e.g., a built-in transistor model instance. A subcircuit component parameter may therefore be safely specified (i.e., it appears in the netlist), or may be left unspecified (i.e., it does not appear in the netlist). Unspecified parameters may acquire their default values according to the defaulting rules of the built-in component model in the simulator program.

Figure 6:
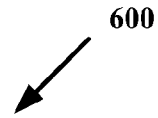
FIG. 6 is an inline inherited subcircuit wrapper netlist for an extended transistor, according to an embodiment.

FIG. 6 shows an inline subcircuit wrapper netlist 600 for an extended transistor that acquires unspecified device/component parameter values from a built-in component model's defaulting rules, according to an embodiment. The inline subcircuit of FIG. 5 may be replaced by the inherited inline subcircuit as shown in FIG. 6. If the vast majority of the device parameter values for the inline component are to be set by default or according to a model card, which is typically the case, only those device model parameters that need to be set by an overriding subcircuit parameter need to be specified.

Line 1 of FIG. 6 is an inline subcircuit declaration, but now the exemplary and non-limiting inheritance designator "inherited" for example denotes that this subcircuit is to be processed differently than other inline subcircuits. The "inherited" keyword may make a subcircuit inherit parameters from an inline component. Line 2 again provides a specific value for subcircuit parameter c1, used later for the circuit element that adds a constant gate-source capacitance to an inline device. Inline component primitive instance parameters w, l, as, ad, ps, and pd are not specified here, so they are to be inherited from an inline component primitive. Line 3 provides an inline component "NMOS", which again shares the same name as the inline subcircuit, but in this case model parameters need not be passed in from the subcircuit parameters. Instead, they may be inherited from the defaulting rules of the inline component primitive as well.

Line 4 defines the added capacitor element using subcircuit parameter c1 from line 2 as before. Line 5 is a built-in model card, that again uses exemplary and non-limiting "bsim4" as its primitive. Built-in model "bsim4" has a pre-defined instance parameter list defined in the simulator program, including parameters like w, l, as, ad, ps, pd, etc., and defaulting rules for those parameters. Line 6 ends the subcircuit definition. Line 7 is an instance X1 of the now-defined inherited inline subcircuit NMOS.

For the instance X1, only w and l are specified, so inline component X1.NMOS inside instance X1 will get the following parameter values:

X1.W=2 u (from line 7, the X1 instance)

X1.L=0.18 u (from line 7, the X1 instance)

However, unspecified inline component parameter values may now be determined according to the built-in model's defaulting rules. Thus, for inherited inline subcircuit wrappers, values for X1.AS, X1.AD, X1.PS, and X1.PD need not be specified. The embodiments may therefore provide the following advantages:

1. An inline subcircuit may inherit parameters from an inline component primitive (e.g., bsim4 as in the example). No explicit parameters are needed on line 2 and line 3 for bsim4 primitive instance parameters, like w, l, as, ad, ps, and pd.
2. Parameters w=2 u and l=0.18 u will get values as before, since these two parameters are specified on the instance.
3. Parameters as, ad, ps, and pd are not specified on X1. These parameters' default values will be calculated from the bsim4 model. This is important, since previous inline subcircuits cannot resolve as, ad, ps, and pd default value issues. The "inherited" feature of the present invention embodiments resolves this issue.

All inline component parameters may now have the flexibility to have their parameters either specified or unspecified. If it is unspecified, the inline component related built-in model will handle it correctly. It is preferable to have a built-in model handle an unspecified parameter, since the default model parameter value determination may be complicated and/or calculated from other parameters.

FIG. 7 shows a nested inline subcircuit wrapper netlist 700 for an extended transistor that acquires unspecified component parameter values from a built-in component model's defaulting rules, according to an embodiment. Like regular inline subcircuits, the inherited inline subcircuits are not limited to the leaf nodes of a circuit design hierarchy. Parameter values may be specified at any level of a design hierarchy and passed downward to nested subcircuit instances. Thus, the parameter values of w=1.23 u and l=4.56 u in the X2 instance of the subcircuit wrapper of type OUTER may be passed downward to the wrapped X1 instance of the subcircuit wrapper of type NMOS.

Figure 8:
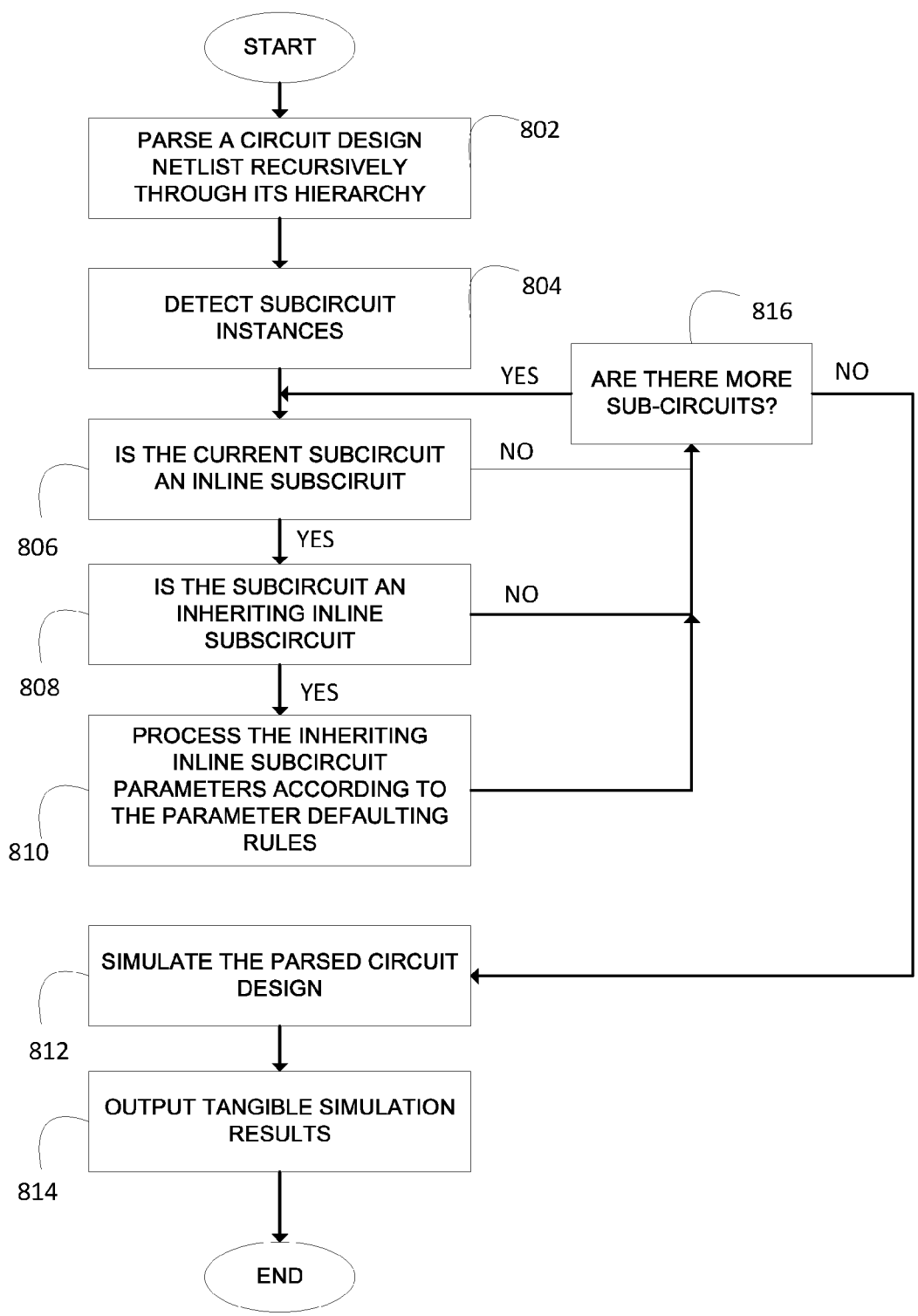
FIG. 8 is a flowchart of inherited inline subcircuit wrapper processing, according to an embodiment.

FIG. 8 shows a flowchart of inherited inline subcircuit wrapper processing, according to an embodiment. A simulation program parser for example may process a design hierarchy by layer in 802, generally starting at the highest design layer and proceeding successively downward recursively. In other words, when a subcircuit instance is encountered in 804, the parser may process any other subcircuits that are contained in that instance. If a particular subcircuit being processed is an inline subcircuit, then in 806 the simulation program may treat the inline subcircuit differently than it treats other subcircuits, as previously described. Further, in 808 the simulation program may distinguish conventional inline subcircuits from inherited inline subcircuits and in 810 apply the new parameter management methodology described above. Steps 806, 808, and 810 are performed for each of the subcircuits that were detected in 804. If the subcircuit is not an inline subcircuit, and if the subcircuit is not an inheriting inline subcircuit, the process continues in accordance with 816. The process also continues in accordance with 816 upon the completion of 810. In 816, it is determined whether more subcircuit instances detected in 804 remain for the analysis in 806, 808, and 810. If so, the process loops back to 806. If no more subcircuit instances remain, the process continues with 812. Once the simulation program parser has loaded a processed netlist into memory, it may proceed to simulate the circuit design in 812, and output tangible simulation results in 814.

To summarize, embodiments of the present invention allow all parameter default values of a subcircuit component to be handled by a subcircuit component primitive model. The embodiments enable a parameter of a subcircuit component values to have real default values that are calculated by a component device model. The embodiments thus resolve the difficulties of component parameter default value handling for inline subcircuits.

Figure 9:
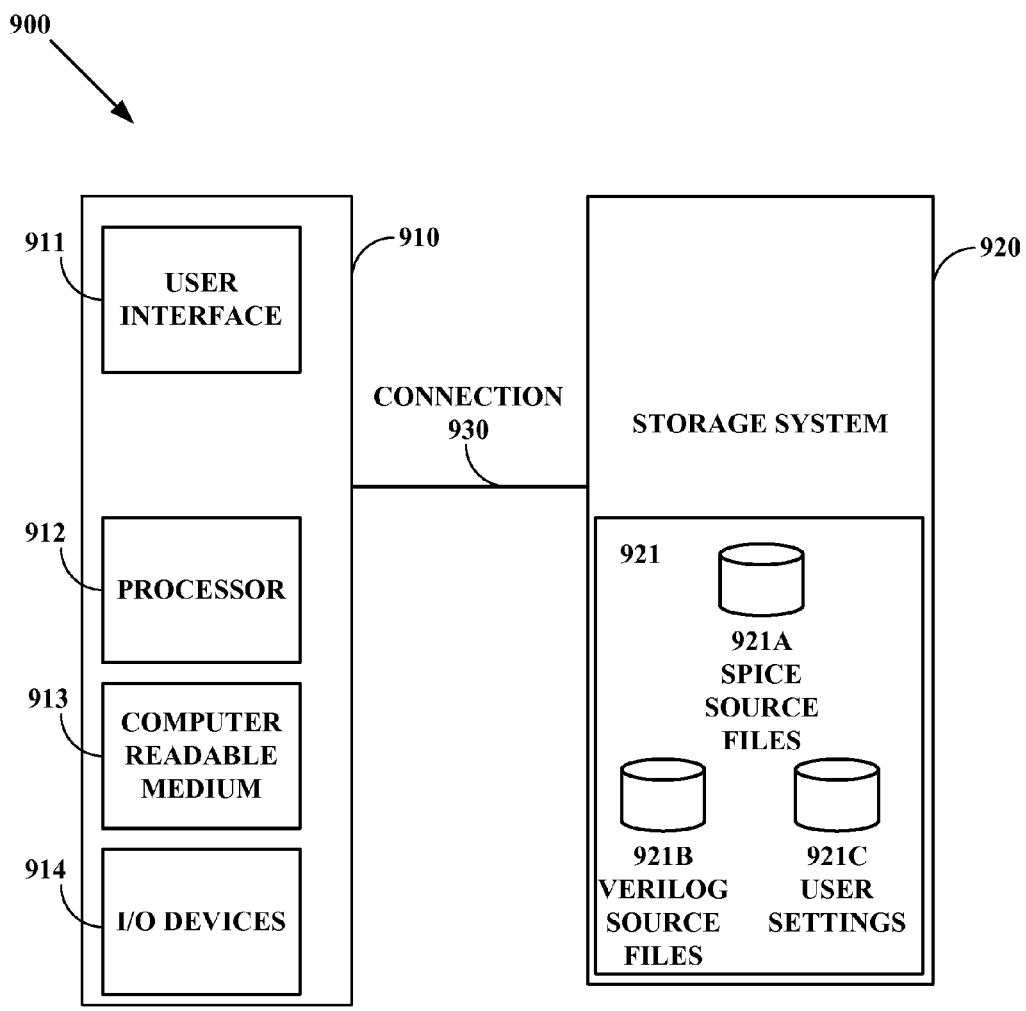
FIG. 9 is a block diagram of a circuit analysis system, according to an embodiment.

FIG. 9 shows a block diagram of an exemplary circuit analysis system 900, according to an embodiment. This system may provide simulator functionality for any of the methods described above. A user may access the system 900 through a standalone client system, client-server environment, or a network environment. System 900 may comprise one or more clients or servers 910, one or more storage systems 920, and a connection or connections 930 between and among these elements.

Client 910 may execute instructions stored on transitory or non-transitory computer readable medium 913 with processor 912, and may provide a user interface 911 to allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a GUI run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media. Databases 921 may be stored in storage system 920 such that they may be persistent, retrieved, or edited by the user. Databases 921 may include SPICE source files 921A, Verilog source files 921B, and a user input database 921C for example. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
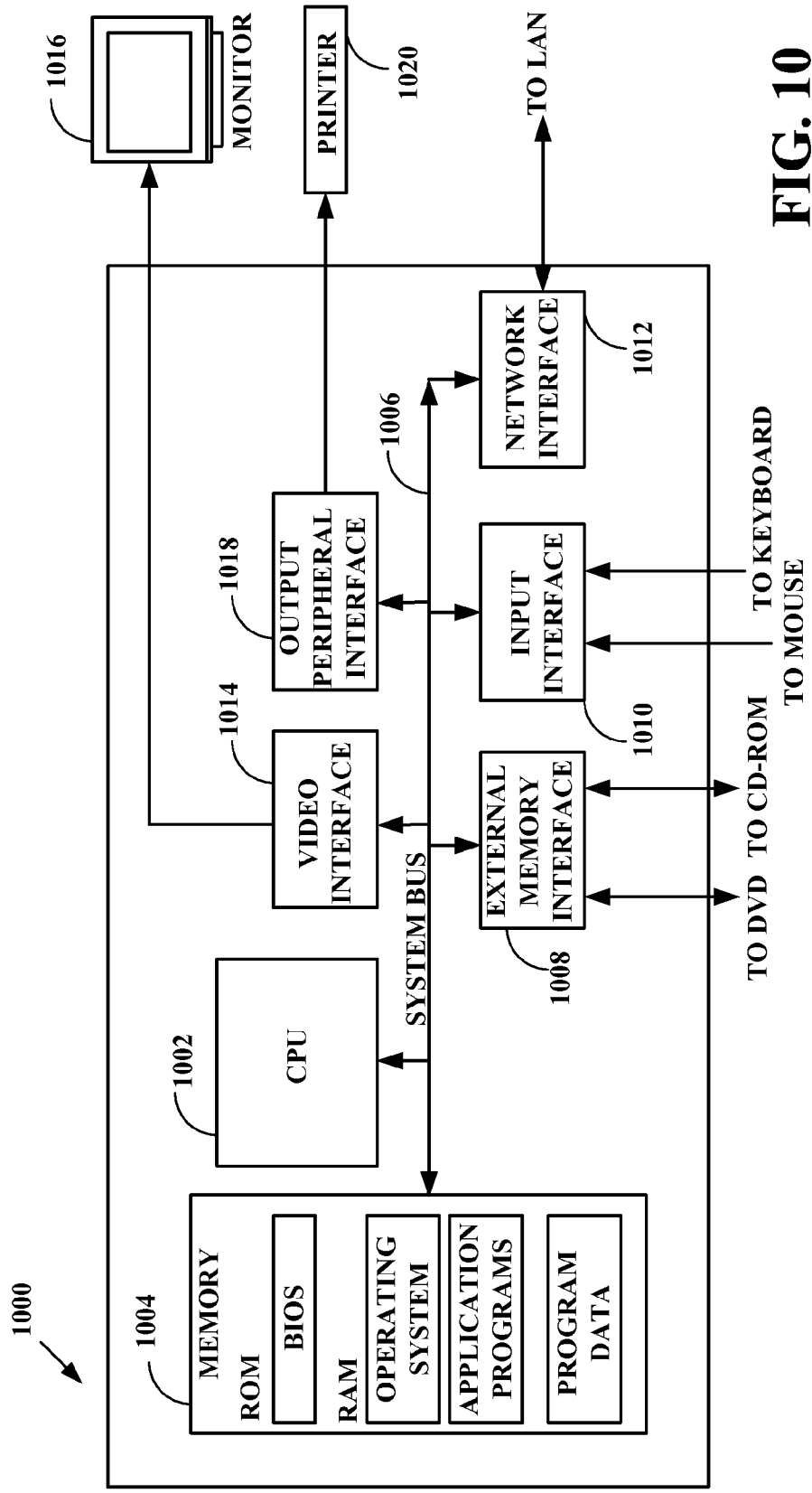
FIG. 10 is a diagram of a computer system, according to an embodiment.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit design tasks, along with software products commercially available for performing computer-aided integrated circuit design tasks. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A computer-implemented method for processing a circuit design, the method comprising:
    placing in a circuit design an inline subcircuit that includes an inline component and an inheritance designator, the inline component represented by a component model;
    responsive to detecting the inheritance designator, assigning a default value to an unspecified inline component model parameter according to a component model parameter defaulting rule;
    simulating the circuit design with a circuit simulator; and
    outputting simulation results.

2. The method of claim 1 wherein the inline subcircuit is called from another layer in a design hierarchy.

3. The method of claim 1 wherein the inline component is a built-in component supported by a circuit simulator.

4. The method of claim 1 wherein the inline component is a user-defined component.

5. The method of claim 1 wherein the inheritance designator is the word "inherited".

6. The method of claim 1 further comprising assigning a particular specified value to an inline component model parameter with at least one of a subcircuit instance line and a subcircuit parameter line.

7. The method of claim 1 further comprising assigning a particular specified value to an inline component model parameter according to the highest design hierarchy level that provides the particular specified value.

8. A non-transitory computer readable medium storing instructions that, when executed by a processor, perform a method for processing a circuit design comprising:
    placing in a circuit design an inline subcircuit that includes an inline component and an inheritance designator, the inline component represented by a component model;
    responsive to detecting the inheritance designator, assigning a default value to an unspecified inline component model parameter according to a component model parameter defaulting rule;
    simulating the circuit design with a circuit simulator; and
    outputting simulation results.

9. The medium of claim 8 wherein the inline subcircuit is called from another layer in a design hierarchy.

10. The medium of claim 8 wherein the inline component is a built-in component supported by a circuit simulator.

11. The medium of claim 8 wherein the inline component is a user-defined component.

12. The medium of claim 8 wherein the inheritance designator is the word "inherited".

13. The medium of claim 8 wherein the method further comprises assigning a particular specified value to an inline component model parameter with at least one of a subcircuit instance line and a subcircuit parameter line.

14. The medium of claim 8 wherein the method further comprises assigning a particular specified value to an inline component model parameter according to the highest design hierarchy level that provides the particular specified value.

15. A system for processing a circuit design, comprising:
    a memory storing executable instructions; and
    a processor executing instructions to:
        place in a circuit design an inline subcircuit that includes an inline component and an inheritance designator, the inline component represented by a component model;
        responsive to detecting the inheritance designator, assign a default value to an unspecified inline component model parameter according to a component model parameter defaulting rule;
        simulate the circuit design with a circuit simulator; and
        output simulation results.

16. The system of claim 15 wherein the inline subcircuit is called from another layer in a design hierarchy.

17. The system of claim 15 wherein the inline component is a built-in component supported by a circuit simulator.

18. The system of claim 15 wherein the inline component is a user-defined component.

19. The system of claim 15 wherein the processor further executes instructions to assign a particular specified value to an inline component model parameter with at least one of a subcircuit instance line and a subcircuit parameter line.

20. The system of claim 15 wherein the processor further executes instructions to assign a particular specified value to an inline component model parameter according to the highest design hierarchy level that provides the particular specified value.

* * * * *